(12) United States Patent
Behrends et al.

(10) Patent No.: US 7,535,776 B1
(45) Date of Patent: May 19, 2009

(54) CIRCUIT FOR IMPROVED SRAM WRITE AROUND WITH REDUCED READ ACCESS PENALTY

(75) Inventors: Derick G. Behrends, Rochester, MN (US); Travis R. Hebig, Rochester, MN (US); Daniel M. Nelson, Rochester, MN (US); Jesse D. Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/170,993

(22) Filed: Jul. 10, 2008

(51) Int. Cl.
*G11C 11/41* (2006.01)
*G11C 11/413* (2006.01)
*G11C 7/22* (2006.01)
*G11C 7/10* (2006.01)

(52) U.S. Cl. .................. 365/189.15; 365/189.05; 365/189.17; 365/189.2; 365/154; 365/233.17

(58) Field of Classification Search .............. 365/154, 365/189.05, 189.15, 189.2, 189.17, 233.17
See application file for complete search history.

(56) References Cited

U.S. PATENT DOCUMENTS

| | | | |
|---|---|---|---|
| 4,620,118 A | | 10/1986 | Barber |
| 5,454,093 A | * | 9/1995 | Abdulhafiz et al. ......... 711/133 |
| 5,612,916 A | * | 3/1997 | Neduva ................. 365/189.04 |
| 5,661,675 A | | 8/1997 | Chin et al. |
| 6,118,717 A | | 9/2000 | Brady |
| 6,271,683 B1 | | 8/2001 | Horne et al. |
| 6,493,257 B1 | | 12/2002 | Coughlin, Jr. et al. |
| 6,711,051 B1 | | 3/2004 | Poplevine et al. |
| 2006/0268656 A1 | | 11/2006 | Yokoyama |

* cited by examiner

*Primary Examiner*—J. H. Hur
(74) *Attorney, Agent, or Firm*—Suiter Swantz pc llo

(57) ABSTRACT

A method for passing data from an input to an output of a domino read access path in domino read SRAM memory including receiving at least a portion of the input data from a latch configuration, gating a global precharge signal, gating a bit select circuitry signal, driving the input data statically through a transmission gate of a static bypass multiplexer to the global dot of the domino read SRAM memory, initiating a write around cycle signal, offsetting the write around signal input into the static bypass multiplexer and the precharge signal by at least one phase using a wave shaper, driving the input data from the global dot through a keeper circuit, and driving the input data from the keeper circuit to at least one NAND gate of a pair of cross-coupled NAND gates, the pair of cross-coupled NAND gates being configured in a transparent state.

1 Claim, 2 Drawing Sheets

CIRCUIT FOR IMPROVED SRAM WRITE AROUND WITH REDUCED READ ACCESS PENALTY

TECHNICAL FIELD

The present disclosure generally relates to the field of memory devices, and more particularly to a method for passing data from an input to an output of a read access path in domino read SRAM.

BACKGROUND

The ability to pass data from an input to an output without writing data into memory is often required in the operation of high performance domino read memory (SRAM) devices. A system passing data from a memory input to a memory output without writing data into memory is said to operate in write around mode or bypass mode. Standard methods for passing data from a memory input to a memory output without writing data into memory involve using a dynamic bit multiplexer.

SUMMARY

The present disclosure is directed to a method for passing data from an input to an output of a domino read access path in domino read SRAM memory including, but not limited to, receiving at least a portion of the input data from a latch configuration, including a L1-only latch configuration; gating a global precharge signal using a first logic device; gating a bit select circuitry signal using a second logic device; driving the input data statically from the latch configuration through a transmission gate of a static bypass multiplexer to the global dot of the domino read SRAM memory; initiating a write around cycle signal using an internal clock; offsetting the write around signal input into the static bypass multiplexer and the precharge circuit element signal by at least one phase using a wave shaper; driving the input data from the global dot through a keeper circuit; and driving the input data from the keeper circuit to at least one NAND gate of a pair of cross-coupled NAND gates, the pair of cross-coupled NAND gates being configured in a transparent state for switching between a high output state and a low output state.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
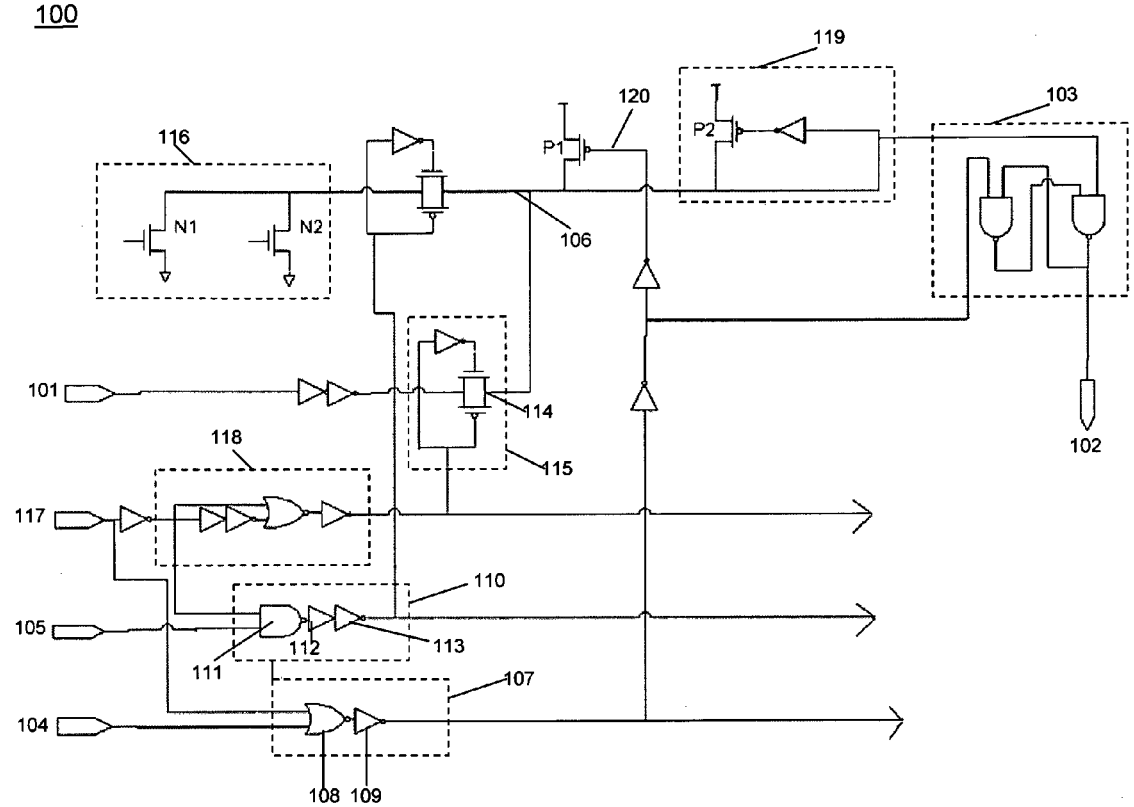
FIG. 1 is a schematic diagram illustrating a method for passing data from an input to an output of a domino read access path in domino read SRAM memory.

Referring to FIG. 1, a schematic 100 for passing data from an input 101 to an output 102 of a domino read access path in domino read SRAM memory in accordance with an exemplary embodiment of the present invention is shown. At least a portion of the input data is delivered to the data input 101 using a latch configuration. For example, an L1-only latch configuration may be used to deliver data to the data input to maintain the precharge circuit element signal 120 timing.

The global precharge signal 104 and the bit select circuitry signal 105 may be gated appropriately to avoid DC contention when transforming the gdot signal 106 from a dynamic net to a static net. The global precharge signal 104 may be gated with the write around signal 117 using a first logic device. For example, the first logic device 107 used to gate the global precharge signal 104 may include a NOR gate 108 followed by an inverter 109. The bit select circuitry signal 105 may be gated with the inverse of the write around signal 117 using a second logic device. For example, the second logic device 110 used to gate the bit select circuitry signal may include NAND gate 111, followed by inverters 112 and 113.

The input data received from the latch configuration is driven statically through a transmission gate 114 of a static bypass multiplexer 115 to the global dot 106 of the domino read SRAM memory 116. A write around cycle signal 117 may be initiated using an internal clock. For example, the write around cycle signal 117 may be initiated by a falling inverse clock (NCLK) signal. Moreover, the write around signal inputted into the static bypass multiplexer 115 may be offset relative to the precharge circuit element signal 120. For example, the write around signal inputted into the static bypass multiplexer 115 and the precharge circuit element signal 120 may be offset by at least one phase using a wave shaper 118.

The input data is driven from the global dot 106 of the domino read SRAM memory 116 through a keeper circuit 119. The input data is then driven from the keeper circuit 119 to at least one NAND gate of a pair of cross-coupled NAND gates 103. The pair of cross-coupled NAND gates are configured to be in a transparent state, allowing data to be switched between a high output state and a low output state when the system is in the write around mode of operation. Alternatively, the input data may be driven to a pull-down stack on the dynamic output of the domino read SRAM memory core.

Figure 2:
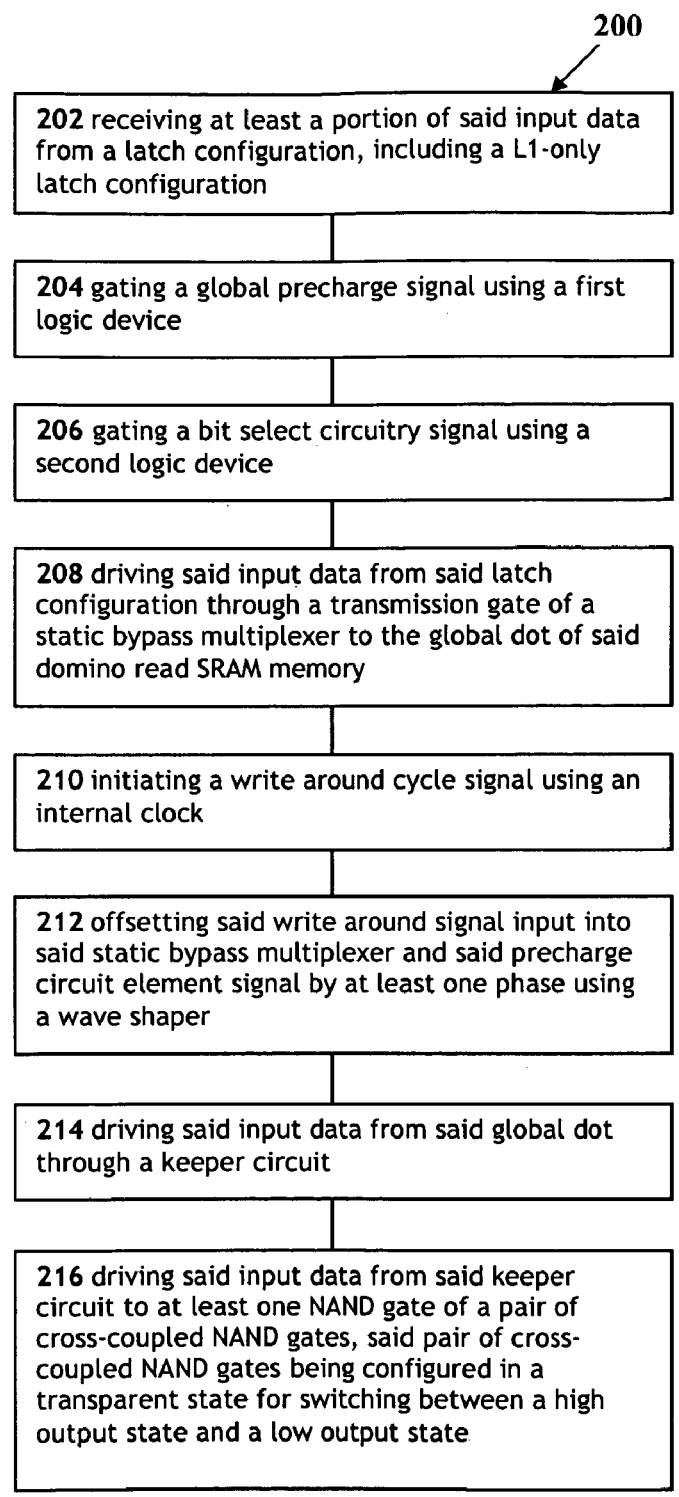
FIG. 2 is a flow diagram of the method for passing data from an input to an output of a domino read access path in domino read SRAM memory.

Referring to FIG. 2, a method 200 for passing data from an input to an output of a domino read access path in domino read SRAM memory is described. At step 202, the method receives at least a portion of the input data from a latch configuration, including a L1-only configuration. At step 204, the method gates a global precharge signal using a first logic device. At step 206, the method gates a bit select circuitry signal using a second logic device. At step 208, the method drives the input data statically from the latch configuration through a transmission gate of a static bypass multiplexer to a global dot of the domino read SRAM memory. At step 210, the method initiates a write around cycle signal using an internal clock. At step 212, the method offsets the write around signal input into the static bypass multiplexer and the precharge circuit element signal by at least one phase using a wave shaper. At step 214, the method drives the input data from the global dot through a keeper circuit. At step 216, the method drives the input data from the keeper circuit to at least one NAND gate of a pair of cross-coupled NAND gates, the pair of cross-coupled NAND gates being configured in a transparent state for switching between a high output state and a low output state.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for passing static data from an input to an output of a domino read access path in a domino read SRAM, comprising:

receiving at least a portion of said input data from a latch configuration, including a L1-only latch configuration;

gating a global precharge signal using a first logic device;

gating a bit select circuitry signal using a second logic device;

driving said input data statically from said latch configuration through a transmission gate of a static bypass multiplexer to a global dot of said domino read SRAM;

initiating a write around cycle signal using an internal clock;

offsetting said write around signal input into said static bypass multiplexer and said precharge circuit element signal by at least one phase using a wave shaper;

driving said input data from said global dot through a keeper circuit;

driving said input data from said keeper circuit to at least one NAND gate of a pair of cross-coupled NAND gates, said pair of cross-coupled NAND gates being configured in a transparent state for switching between a high output state and a low output state.

* * * * *